United States Patent
Lin et al.

(10) Patent No.: US 12,191,631 B2
(45) Date of Patent: Jan. 7, 2025

(54) LASER WITH PEROVSKITE GAIN LAYER

(71) Applicant: University of Washington, Seattle, WA (US)

(72) Inventors: Lih-Yuan Lin, Seattle, WA (US); Chen Zou, Seattle, WA (US)

(73) Assignee: University of Washington, Seattle, WA (US)

( * ) Notice: Subject to any disclaimer, the term of this patent is extended or adjusted under 35 U.S.C. 154(b) by 1032 days.

(21) Appl. No.: 17/054,245

(22) PCT Filed: May 10, 2019

(86) PCT No.: PCT/US2019/031647
§ 371 (c)(1),
(2) Date: Nov. 10, 2020

(87) PCT Pub. No.: WO2019/217771
PCT Pub. Date: Nov. 14, 2019

(65) Prior Publication Data
US 2021/0098966 A1   Apr. 1, 2021

Related U.S. Application Data

(60) Provisional application No. 62/670,481, filed on May 11, 2018.

(51) Int. Cl.
*H01S 5/12*      (2021.01)
*H01S 5/042*    (2006.01)
(Continued)

(52) U.S. Cl.
CPC ...... *H01S 5/04253* (2019.08); *H01S 5/18325* (2013.01); *H01S 5/18341* (2013.01); *H01S 5/187* (2013.01)

(58) Field of Classification Search
CPC ........................................................ H01S 5/12
See application file for complete search history.

(56) References Cited

U.S. PATENT DOCUMENTS 6,529,541 B1   3/2003   Ueki et al.
7,807,985 B2   10/2010  Itoh
(Continued)

FOREIGN PATENT DOCUMENTS

CN    106129808 A        11/2016
CN    106972343 A   *    7/2017    ............... H01S 5/04
(Continued)

OTHER PUBLICATIONS

Machin Translation of Shimoyama JP 2013219192 (Year: 2013).*
(Continued)

*Primary Examiner* — Minsun O Harvey
*Assistant Examiner* — Stephen Sutton Kotter
(74) *Attorney, Agent, or Firm* — McDonnell Boehnen Hulbert & Berghoff LLP

(57) ABSTRACT

Within examples, a laser includes a first electrode and a second electrode; a first transport layer and a second transport layer that are between the first electrode and the second electrode; a gain layer positioned between the first transport layer and the second transport layer, where the gain layer comprises a material having a Perovskite crystal structure; and a substrate on which the first electrode, the second electrode, the first transport layer, the second transport layer, and the gain layer are formed, where a distributed feedback (DFB) waveguide is formed within the first transport layer, and where the laser is configured such that a current flowing through the gain layer between the first electrode and the second electrode causes the gain layer to emit coherent light.
(Continued)

Examples also include methods for fabricating the laser, as well as additional lasers and methods for forming those lasers.

20 Claims, 7 Drawing Sheets

(51) Int. Cl.
*H01S 5/183* (2006.01)
*H01S 5/187* (2006.01)

(56) References Cited

U.S. PATENT DOCUMENTS

| | | | |
|---|---|---|---|
| 9,966,726 B2 | 5/2018 | Xing et al. | |
| 2002/0018620 A1 | 2/2002 | Koyama et al. | |
| 2013/0266034 A1* | 10/2013 | Yu | H01S 5/12 |
| | | | 372/27 |
| 2016/0204386 A1 | 7/2016 | Wiesmann et al. | |
| 2017/0012404 A1* | 1/2017 | Xing | H01S 5/36 |

FOREIGN PATENT DOCUMENTS

| | | |
|---|---|---|
| CN | 107381625 A | 11/2017 |
| CN | 108063365 A | 5/2018 |
| JP | 2013219192 A * | 10/2013 |

OTHER PUBLICATIONS

Machine Translation of Chen CN 106972343 (Year: 2017).*
International Search Report mailed Jul. 19, 2019 for International Application No. PCT/US2019/031647, 2 pages.
Bergren, M R, et al., "Electron transfer in hydrogenated nanoaystalline silicon observed by time-resolved terahertz spectroscopy," Physical Review B 87(8):081301, 2013.
Cha, H, et al., "Single-Mode Distributed Feedback Laser Operation in Solution-Processed Halide Perovskite Alloy System," Advanced Optical Materials: 1700545, 2017.
Cha, H, et al., "Two-dimensional Photonic Crystal Bandedge Laser with Hybrid Perovskite Thin Film for Optical Gain," Applied Physics Letters, 108(18):181104, 2016.
Chen, S, "A Photonic Crystal Laser from Solution Based Organolead Iodide Perovskite Thin Films," ACS Nano, 10 (4):3959-3967, 2016.
Chen, S, et al., "High-Q, Low-Threshold Monolithic Perovskite Thin-Film Vertical-Cavity Lasers," Adv Mater, 29 (16):160781, 2017.
Chiba, T, et al., "High Efficiency Perovskite Quantum-Dot Light-Emitting Devices by Effective Washing Process and Inlerfacial Energy Level Alignment," ACS Applied Materials & Interfaces, 9(21):18054-18060, 2017.
Cho, H, et al., "Overcoming the electroluminescence efficiency limitations of perovskite light-emitting diodes," Science 350(6265):1222-1225, 2015.
Crisp, R W, et al., "Metal Halide Solid-State Surface Treatment for High Efficiency PbS and PbSe QD Solar Cells," Scientific Reports 5:9945, 2015.
De Wolf, S, et al., "Organometallic Halide Perovskites: Sharp Optical Absorption Edge and Its Relation to Photovoltaic Performance," The Journal of Physical Chemistry Letters, 5(6):1035-1039, 2014.
Eaton, S W, et al., "Lasing in Robust Cesium Lead Halide Perovskite Nanowires," Proceedings of the National Academy of Sciences, 113(8):1993-1998, 2016.
Fu, Y, et al., Broad Wavelength Tunable Robust Lasing from Single-crystal Nanowires of Cesium Lead Halide Perovskites (CsPbX3, X=Cl, Br, I), ACS Nano, 10(8):7963-7972, 2016.
He, X., et al., "Patterning Multicolored Microdisk Laser Arrays of Cesium Lead Halide Perovskite," Advanced Materials, 29:16604510, 2017.

Hierz, L M, et al., "Charge-Carrier Mobilities in Metal Halide Perovskites: Fundamental Mechanisms and Limits," ACS Energy Letters, 2(7):1539-1548, 2017.
Huang, C-Y, et al., "CsPbBr3 perovskite quantum dot vertical cavity lasers with low threshold and high stability," ACS Photonics 4(9), 2281-2289, 2017.
Ip, A H, et al., "Hybrid passivated colloidal quantum dot solids," Nat Nano, 7(9):577-582, 2012.
Jia, Y, et al., "Diode-pumped organo-Lead halide perovskite lasing in a metal-clad distributed feedback resonator," Nano letters, 16(7):4624-4629, 2016.
Jing, P, et al., "Optical Trapping on Two-Dimensional Photonic Crystal and Cell Viability Characterization," OSA Optics in the Life Sciences Congress. Vancouver, BC, Canada, Apr. 12-15, 2015.
Jing, P, et al., "Patterning and Colonizing Stem Cells and Optical Trapping," OSA Biophotonics Congress: Optics in the Life Sciences, San Diego, CA, Apr. 2-5, 2017.
Jing, P, et al., "Photonic Crystal Optical Tweezers with High Efficiency for Live Biological Samples and Viability Characterization," Scientific Reports 6:19924, 2016.
Karnutsch, C., et al., "Improved organic semiconductor lasers based on a mixed-order distributed feedback resonator design," Applied Physics Letters, 90(13):131104, 2007.
Keeler, E G, et al., "MEMS Resonant Mass Sensor with Enabled Optical Trapping," The 12th Annual IEEE International Conference on Nano/Micro Engineered and Molecular Systems (IEEE-NEMS), UCLA, Los Angeles, CA, Apr. 9-12, 2017.
Keeler, E G, et al., "MEMS Resonator and Photonic Crystal Integration for Enhanced Cellular Mass Sensing," 9th NAMIS International Summer School, Montreal, Canada, Jun. 29-Jul. 3, 2015. (Best Scientific Poster Award).
Keeler, E G, et al., "Optical-trapping enhanced MEMS-resonant mass detection for biological applications," 10th NAMIS International Autumn School ("Micro/nano technologies for future health, environment and sustainability"), Japan, Sep. 12-16, 2016.
Kim, J H, et al., "Enhanced Environmental Stability of Planar Heterojunction Perovskite Solar Cells Based on Blade-Coating," Advanced Energy Materials, 5(4):1401229, 2015.
Kim, Y K, et al., "Gene-Edited Human Kidney Organoids Reveal Mechanisms of Disease in Podocyte Development," Stem Cells, 35:2366-2378, 2017.
Lan, X, et al., "Passivation Using Molecular Halides Increases Quantum Dot Solar Cell Performance," Advanced Materials, 28(2):299-304, 2016.
Li, G, et al., "Highly Efficient Perovskite Nanocrystal Light-Emitting Diodes Enabled by a Universal Crosslinking Method," Adv Mater 28(18):3528-3534, 2016.
Li, M, et al., "Enhanced Exciton and Photon Confinement in Ruddlesden-Popper Perovskite Microplatelets for Highly Stable Low-Threshold Polarized Lasing," Advanced Materials:1707235, 2018.
Li, Z, et al., "Stabilizing Perovskite Structures by Tuning Tolerance Factor: Formation of Formamidinium and Cesium Lead Iodide Solid-State Alloys," Chemistry of Materials, 28(1):284-292, 2016.
Lin, L Y, et al., "Integrating MEMS Resonators with Optical Trapping for High-accuracy Mass Sensing," The 12th Annual IEEE International Conference on Nano/Micro Engineered and Molecular Systems, Los Angeles, CA, Apr. 9-12, 2017. (Invited).
Lin, L Y, et al., "Optical Modulation and Manipulation of Neurons and Cells and High Efficiency through Quantum Dots and Photonic Crystals," IEEE Nanotechnology Materials and Devices Conference, Anchorage, AK, Sep. 13-16, 2015. (Invited).
Lin, L Y, et al., "Photonic Crystal Optical Tweezers for Living Cells," OSA Biophotonics Congress: Optics in the Life Sciences, San Diego, CA, Apr. 2-5, 2017 (Invited).
Lin, L Y, et al., "Trapping, Sensing and Photostimulation of Cells through Nanostructures," CMOS Emerging Technologies Research (CMOSERT) Conference, Vancouver, BC, Canada, May 20-25, 2015. (Invited).
Ling, Y, et al., "Enhanced Optical and Electrical Properties of Polymer-Assisted All-Inorganic Perovskites for Light-Emitting Diodes," Advanced Materials, 28(40):8983-8989, 2016.

(56) References Cited

OTHER PUBLICATIONS

Liu, M, et al., "Efficient planar heterojunction perovskite solar cells by vapour deposition," Nature 501(7467):395-398, 2013.
Liu, Y, et al., "Robust, Functional Nanocrystal Solids by Infilling with Atomic Layer Deposition," Nano Letters, 11 (12):5349-5355, 2011.
Marshall, A R, et al. "Exploration of Metal Chloride Uptake for Improved Performance Characteristics of PbSe Quantum Dot Solar Cells," The Journal of Physical Chemistry Letters 6(15):2892-2899, 2015.
McGehee, M D, et al., "Semiconducting (conjugated) polymers as materials for solid-state lasers," Advanced Materials, 12(22):1655-1668, 2000.
Miller, O D, et al., "Strong Internal and External Luminescence as Solar Cells Approach the Shockley-Queisser Limit," IEEE Journal of Photovoltaics, 2(3):303-311, 2012.
National Renewable Energy Laboratory, Best Research—Cell Efficiencies Chart. https://www.nrel.gov/pv/assets/images/efficiency-chart.png.
Niu, G, et al., "Review of recent progress in chemical stability of perovskite solar cells," Journal of Materials Chemistry A, 3(17):8970-8980, 2015.
Noh, J H, et al., "Chemical Management for Colorful, Efficient, and Stable Inorganic-Organic Hybrid Nanostructured Solar Cells," Nano Letters, 13(4):1764-1769, 2013.
Ono, L K, et al., "Pinhole-free hole transport layers significantly improve the stability of MAPbl3-based perovskite solar cells under operating conditions," Journal of Materials Chemistry, A 3(30):15451-15456, 2015.
Ponseca, C S, et al., "Organometal Halide Perovskite Solar Cell Materials Rationalized: Ultrafast Charge Generation, High and Microsecond-Long Balanced Mobilities, and Slow Recombination," Journal of the American Chemical Society 136(14):5189-5192, 2014.
Pourdavoud, N, et al., "Photonic Nanostructures Patterned by Thermal Nanoimprint Directly into Organo-Metal Halide Perovskites," Advanced Materials, 29:1605003, 2017.
Protesescu, L, et al., "Nanocrystals of Cesium Lead Halide Perovskites (CsPbX3, X=Cl, Br, and I): Novel Optoelectronic Materials Showing Bright Emission with Wide Color Gamut," Nano Letters, 15(6):3692-3696, 2015.
Raghavan, C M, et al., "Low-Threshold Lasing from 2D Homologous Organic-Inorganic Hybrid Ruddlesden-Popper Perovskite Single Crystals," Nano Letters, 2018.
Rong, Y, et al., "Beyond efficiency: The challenge of stability in mesoscopic perovskite solar cells," Advanced Energy Materials, 5(20): 1501066.
Saliba, M, et al., "Structured Organic-Inorganic Perovskite toward a Distributed Feedback Laser," Advanced Materials, 28(5):923-929, 2016.
Samuel, I D W, et al., "How to recognize lasing," Nature Photonics, 3:546-549, 2009.
Samuel, I D W, et al., "Organic semiconductor lasers," Chem. Rev., 107:1272-1295, 2007.
Sanehira, E M, et al., "Enhanced mobility CsPbI3 quantum dot arrays for record-efficiency, high-voltage photovoltaic cells," Science Advances (accepted), 2017.
Sanehira, E M, et al., "Influence of Electrode Interfaces on the Stability of Perovskite Solar Cells: Reduced Degradation Using MoOx,/Al for Hole Collection," ACS Energy Letters 1(1):38-45, 2016.
Shi, Z, et al., "High-Efficiency and Air-Stable Perovskite Quantum Dots Light-Emitting Diodes with an All-Inorganic Heterostructure," Nano Lett, 17:313-321, 2016.
Smith, M J, et al., "Robust, Uniform, and Highly Emissive Quantum Dot-Polymer Films and Patterns Using Thiol-Ene Chemistry," ACS Applied Materials & Interfaces, 9(20):17435-17448, 2017.
Song, J, et al., "Quantum Dot Light-Emitting Diodes Based on Inorganic Perovskite Cesium Lead Halides (CsPbX3)," Adv Mater, 27(44):7162-7167, 2015.
Stavrinadis, A, et al., "Suppressing Deep Traps in PbS Colloidal Quantum Dots via Facile Iodide Substitutional Doping for Solar Cells with Efficiency > 10%," ACS Energy Letters, 2(4):739-744, 2017.
Stranks, S D, et al., "Metal-halide perovskites for photovoltaic and light-emitting devices," Nature Nanotechnology, 10(5):391-402, 2015.
Sutherland, B R, et al., "Perovskite photonic sources," Nature Photonics, 10(5):295-302, 2016.
Swarnkar, A, et al., "Quantum dot-induced phase stabilization of 1-CsPbl3 perovskite for high-efficiency photovoltaics," Science 354(6308):92-95, 2016.
Tan, Z-K, et al., "Bright light-emitting diodes based on organometal halide perovskite," Nature Nanotechnology, 9 (9):687-692, 2014.
Tang, J, et al., "Colloidal-quantum-dot photovoltaics using atomic-ligand passivation," Nat Mater, 10(10):765-771, 2011.
Wang, J, et al., "Interfacial Control Toward Efficient and Low-Voltage Perovskite Light-Emitting Diodes," Advanced Materials, 27(14):2311-2316, 2015.
Wang, Y, et al., "All-Inorganic Colloidal Perovskite Quantum Dots: A New Class of Lasing Materials with Favorable Characteristics," Adv Mater, 27(44):7101-7108, 2015.
Wang, Y, et al., "Solution-processed low threshold vertical cavity surface emitting lasers from all-inorganic perovskite hanocrystals," Advanced Functional Materials, Vo. 27, Iss. 13, Art. 1605088, 2017.
Wei, Z H, et al., "Solution-processed highly bright and durable cesium lead halide perovskite light-emitting diodes," Nanoscale 8(42):18021-18026, 2016.
Whitworth, G L, et al., "Nanoimprinted distributed feedback lasers of solution processed hybrid perovskites," Opt. Express, 24(21):23677-23684, 2016.
Wong, A B, et al., "Growth and Anion Exchange Conversion of CH3NH3PbX3 Nanorod Arrays for Light-Emitting Diodes," Nano Letters, 15(8):5519-5524, 2015.
Xing, G, et al., "Long-Range Balanced Electron- and Hole-Transport Lengths in Organic-Inorganic CH3NH3PbI3," Science 342(6156):344-347, 2013.
Yang, J, et al., "Investigation of CH3NH3PbI3 Degradation Rates and Mechanisms is Controlled Humidity Environments Using in Situ Techniques," ACS Nano 9(2):1955-1963, 2015.
Yang, X, et al., "Efficient green light-emitting diodes based on quasi-two-dimensional composition and phase engineered perovskite with surface passivation," Nature Communications, 9(1):570, 2018.
Yassitepe, E, et al., "Amine-Free Synthesis of Cesium Lead Halide Perovskite Quantum Dots for Efficient Light-Emitting Diodes," Advanced Functional Materials, 26(47):8757-8763, 2016.
Yin, W-J, et al., "Unusual defect physics in CH3NH3PbI3 perovskite solar cell absorder," Applied Physics Letters, 104(6):063903, 2014.
Zhang, X, et al., "Enhancing the brightness of cesium lead halide perovskite nanocrystal based green light-emitting devices through the interface engineering with perfluorinated ionomer," Nano letters, 16(2):1415-1420, 2016.
Zhang, X, et al., "Plasmonic Perovskite Light-Emitting Diodes Based on the Ag-CsPbBr3 System," ACS Appl. Mater. Interfaces, 9(5):4926-4931, 2017.
Zhang, X, et al., All-Inorganic Perovskite Nanocrystals for High-Efficiency Light Emitting Diodes: Dual-Phase CsPbBr3-CsPb2Br5 Composites, Advanced Functional Materials, 26(25):4595-4600, 2016.
Zou, C, et al., "Highly stable cesium lead iodide perovskite quantum dot light-emitting diodes," Nanotechnology 28(45):455201, 2017.

\* cited by examiner

LASER WITH PEROVSKITE GAIN LAYER

CROSS-REFERENCE TO RELATED APPLICATION

This application is a § 371 national stage application of International Application No. PCT/US2019/031647, filed on May 10, 2019, which claims priority to U.S. Provisional Patent Application No. 62/670,481, filed on May 11, 2018, the contents of both of which are incorporated herein by reference in their entirety.

BACKGROUND

Unless otherwise indicated herein, the materials described in this section are not prior art to the claims in this application and are not admitted to be prior art by inclusion in this section.

Photonic integrated circuits with their small component size and high integration density have been regarded as a technology that can potentially provide advancement in computing and communication systems. Components in photonic integrated circuits can include lasers, waveguides, modulators, and photodetectors that can be lithographically defined and fabricated on low-cost silicon (Si) or other platforms such as glass and flexible substrates to achieve system functionality. Among these, lasers have perhaps been the most challenging to integrate due to somewhat incompatible fabrication processes used respectively for laser gain materials and the substrate materials. Traditional lasers integrated on a silicon platform typically use inorganic materials like GaAs or GaN as a gain layer, which can involve complex, high cost, and high temperature fabrication procedures (e.g., molecular beam epitaxy growth).

SUMMARY

In a first aspect, the disclosure includes a laser comprising a substrate; a first electrode; a first distributed Bragg reflector (DBR) positioned between the substrate and the first electrode; a second DBR; a second electrode; a gain layer positioned between the first DBR and the second DBR, wherein the gain layer comprises a material having a Perovskite crystal structure; a first transport layer positioned between the gain layer and the first electrode; and a second transport layer positioned between the gain layer and the second electrode, wherein the laser is configured such that a current flowing through the gain layer between the first electrode and the second electrode causes the gain layer to emit coherent light.

In a second aspect, the disclosure includes a method of fabricating a laser, the method comprising: forming a first distributed Bragg reflector (DBR) on a substrate; forming a first electrode on the first DBR; forming a first transport layer on the first electrode; forming, via spin coating deposition or evaporation deposition, a gain layer on the first transport layer, wherein the gain layer comprises a material having a Perovskite crystal structure; forming a second transport layer on the gain layer; forming a second electrode on the second transport layer such that the second electrode comprises an aperture; and forming a second DBR within the aperture of the second electrode.

In a third aspect, the disclosure includes a laser comprising: a first electrode and a second electrode; a first transport layer and a second transport layer that are between the first electrode and the second electrode; a gain layer positioned between the first transport layer and the second transport layer, wherein the gain layer comprises a material having a Perovskite crystal structure; and a substrate on which the first electrode, the second electrode, the first transport layer, the second transport layer, and the gain layer are formed, wherein a distributed feedback (DFB) waveguide is formed within the first transport layer, and wherein the laser is configured such that a current flowing through the gain layer between the first electrode and the second electrode causes the gain layer to emit coherent light.

In a fourth aspect, the disclosure includes a method of fabricating a laser, the method comprising: providing a substrate having a first electrode on the substrate; forming a first transport layer on the substrate; forming a distributed feedback (DFB) waveguide within the first transport layer; forming a gain layer on the DFB waveguide, wherein the gain layer comprises a material having a Perovskite crystal structure; forming a second transport layer on the gain layer; and forming a second electrode on the second transport layer, wherein the laser is configured such that a current flowing through the gain layer between the first electrode and the second electrode causes the gain layer to emit coherent light.

When the term "substantially" or "about" is used herein, it is meant that the recited characteristic, parameter, or value need not be achieved exactly, but that deviations or variations, including, for example, tolerances, measurement error, measurement accuracy limitations, and other factors known to those of skill in the art may occur in amounts that do not preclude the effect the characteristic was intended to provide. In some examples disclosed herein, "substantially" or "about" means within +/−0-5% of the recited value.

These, as well as other aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrate the invention by way of example only and, as such, that numerous variations are possible.

DETAILED DESCRIPTION

Lasers that are more easily incorporated into photonic integrated circuits are needed. Examples of such lasers and methods for fabricating them are discussed in the present disclosure.

Within examples, a laser includes a substrate, a first electrode, a first distributed Bragg reflector (DBR) positioned between the substrate and the first electrode, a second DBR, a second electrode, and a gain layer positioned between the first DBR and the second DBR The gain layer comprises a material having a Perovskite crystal structure. The laser also includes a first transport layer positioned between the gain layer and the first electrode and a second transport layer positioned between the gain layer and the second electrode. The laser is configured such that a current flowing through the gain layer between the first electrode and the second electrode causes the gain layer to emit coherent light. The laser takes the form of an electrically pumped vertical cavity Perovskite laser. The gain layer of the laser will generally be deposited via spin-coating deposition or evaporation deposition.

In another example, a laser includes a first electrode and a second electrode, a first transport layer and a second transport layer that are between the first electrode and the second electrode, and a gain layer positioned between the first transport layer and the second transport layer. The gain layer comprises a material having a Perovskite crystal structure. The laser also includes a substrate on which the first electrode, the second electrode, the first transport layer, the second transport layer, and the gain layer are formed. A distributed feedback (DFB) waveguide is formed within the first transport layer and the laser is configured such that a current flowing through the gain layer between the first electrode and the second electrode causes the gain layer to emit coherent light. The laser takes the form of an electrically pumped edge emitting Perovskite laser. The gain layer of the laser will generally be deposited via spin-coating deposition or evaporation deposition.

Figure 1:
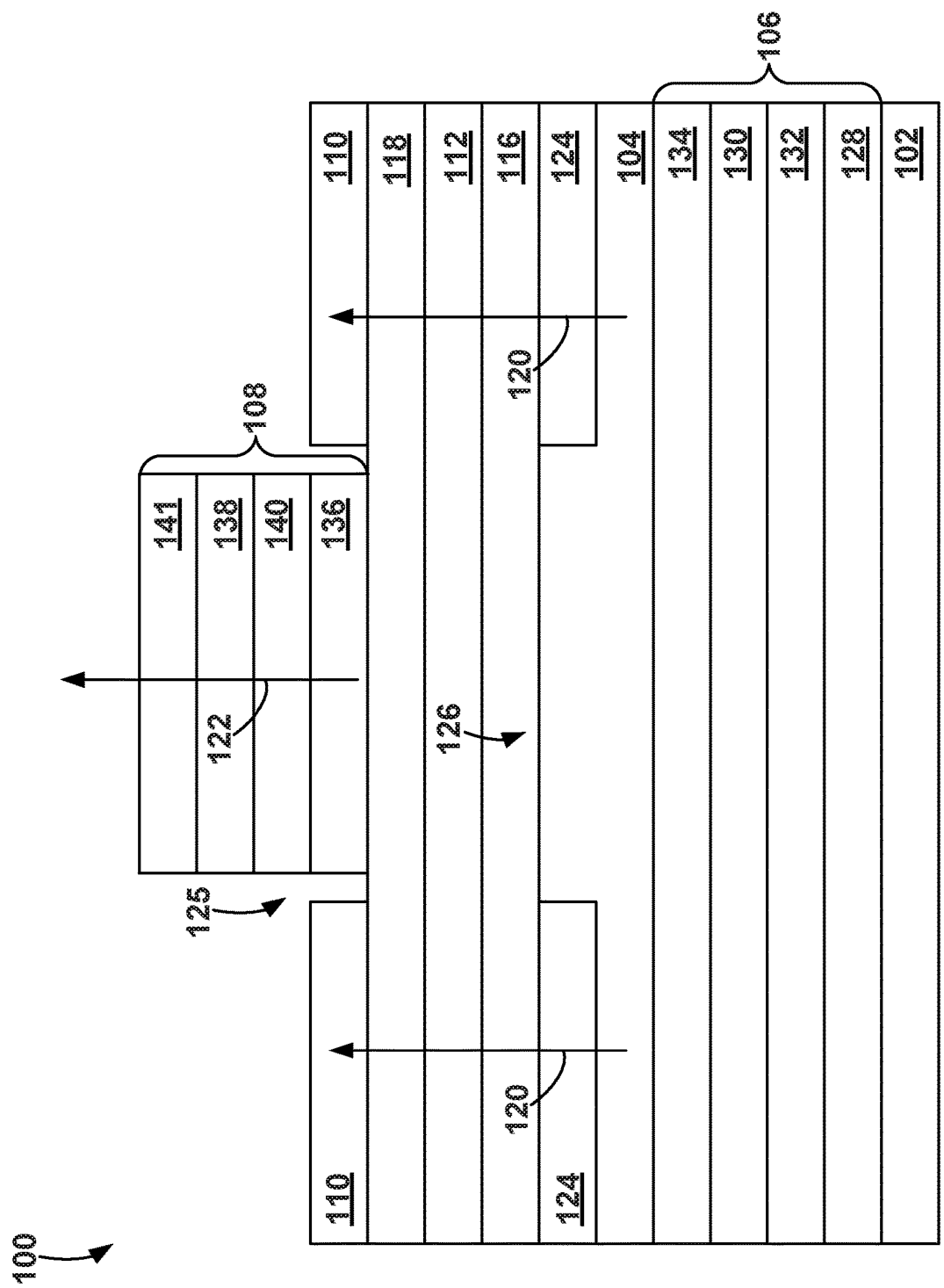
FIG. 1 is a front view cross-sectional schematic diagram of a laser, according to an example embodiment.

FIG. 1 is a front view cross-sectional schematic diagram of a laser 100. The laser 100 includes a substrate 102, a first electrode 104, a first distributed Bragg reflector (DBR) 106 positioned between the substrate 102 and the first electrode 104, a second DBR 108, a second electrode 110, and a gain layer 112 positioned between the first DBR 106 and the second DBR 108. The gain layer 112 includes a material having a Perovskite crystal structure. The laser 100 also includes a first transport layer 116 positioned between the gain layer 112 and the first electrode 104 and a second transport layer 118 positioned between the gain layer 112 and the second electrode 110. The laser 100 is configured such that a current 120 flowing through the gain layer 112 between the first electrode 104 and the second electrode 110 causes the gain layer 112 to emit coherent light 122 (e.g., via stimulated emission). The laser can be configured such that the coherent light 122 emitted by the gain layer 112 passes through an aperture 125 of the second electrode 110.

Herewith, the term "coherent light" can refer to multiple light waves having a common waveform, substantially equal oscillation frequencies, and a constant (e.g., zero) phase difference. Coherent light will generally exhibit constructive interference.

The substrate 102 can be formed of one or more of silicon, gallium arsenide, glass, or a flexible material. Typically, the substrate 102 is a wafer of monocrystalline silicon or monocrystalline gallium arsenide, a slab of glass (e.g., silicon dioxide), or a piece of flexible plastic or fabric.

The first electrode 104 is generally formed of a substantially transparent and electrically conductive material such as indium tin oxide. The first electrode 104 is positioned on top of and/or in contact with the first DBR 106.

The first DBR 106 includes a first layer 128 having a first index of refraction. The first layer 128 is on top of and/or in contact with the substrate 102. The first DBR 106 also includes a second layer 130 having the first index of refraction. The first DBR 106 also includes a third layer 132 between and/or in contact with the first layer 128 and the second layer 130. The third layer 132 has a second index of refraction that is unequal to the first index of refraction. The first DBR 106 also includes a layer 134 having the second index of refraction. The layer 134 is on top of and/or in contact with the second layer 130. Thus, the first DBR 106 includes alternating layers of materials having alternating indices of refraction, forming a low loss reflective structure. In other embodiments, the first DBR can include many more alternating layers of materials having alternating indices of refraction. In some embodiments, the first layer 128 and the second layer 130 can be formed of titanium dioxide and the third layer 132 and the layer 134 can be formed of silicon dioxide.

The second DBR 108 is positioned within the aperture 125 of the second electrode 110. The second DBR 108 includes a fourth layer 136 having a third index of refraction. The fourth layer 136 is on top of and/or in contact with the second transport layer 118. The second DBR 108 also includes a fifth layer 138 having the third index of refraction. The second DBR 108 also includes a sixth layer 140 between and/or in contact with the fourth layer 136 and the fifth layer 138. The sixth layer 140 has a fourth index of refraction that is unequal to the third index of refraction. The second DBR 108 also includes a layer 141 having the fourth index of refraction. The layer 141 is on top of and/or in contact with the fifth layer 138. Thus, the second DBR 108 includes alternating layers of materials having alternating indices of refraction, forming a low loss reflective structure. In other embodiments, the second DBR can include many more alternating layers of materials having alternating indices of refraction. In some embodiments, the fourth layer 136 and the fifth layer 138 can be formed of zinc sulfide and the sixth layer 140 and the layer 141 can be formed of magnesium fluoride.

The second electrode 110 can be formed of a metal such as aluminum and includes an aperture 125 in which the second DBR 108 is formed.

The gain layer 112 is positioned between the first electrode 104 and the second electrode 110. The gain layer 112 includes a material having a Perovskite crystal structure, such as a bulk Perovskite material, a quasi-2D Ruddlesden-Popper (RP) perovskite ($(PEABr)_2(MABr)_{n-1}Pb_nBr2_n$), or a quantum dot Perovskite material. The material could be $CsPbBr_3$, for example. A Perovskite material included in the gain layer 112 will generally have the chemical formula $AQX_nY_{3-n}$ where A is methylammonium (MA), formamidinium (FA), or Cs, where X and Y is I, Br, or Cl, and where Q is Pb or Sn. Stimulated emission within the gain layer 112 is the source of the coherent light 122.

The first transport layer 116 provides either holes or electrons that can take part in a recombination process within the gain layer 112 to emit the coherent light 122. The first transport layer 116 is positioned on top of and/or in contact with the first electrode 104 and an electrically insulating layer 124. In some embodiments, the first transport layer 116 is a hole transport layer and can include poly polystyrene sulfonate (PEDOT:PSS). In other embodiments, the first transport layer 116 is an electron transport layer and can include 1,3,5-tris(1-phenyl-1Hbenzo[d]imidazol-2-yl) benzene (TPBI), zinc oxide, and/or lithium fluoride.

The second transport layer 118 provides either holes or electrons that can take part in a recombination process within the gain layer 112 to emit the coherent light 122. For example, if the first transport layer 116 provides holes, the second transport layer 118 provides electrons, and vice versa. The second transport layer 118 is positioned on top of and/or in contact with the gain layer 112. In some embodiments, the second transport layer 118 is a hole transport layer and can include poly polystyrene sulfonate (PEDOT: PSS). In other embodiments, the second transport layer 118 is an electron transport layer and can include 1,3,5-tris(1-phenyl-1Hbenzo[d]imidazol-2-yl)benzene (TPBI) zinc oxide, and/or lithium fluoride.

The current 120 that causes the emission of the coherent light 122 can be provided by an external power supply that is connected to the first electrode 104 and the second electrode 110. As such, the laser 100 is an electrically pumped vertical cavity laser.

The coherent light 122 will have a narrow bandwidth of wavelengths due to stimulated emission caused by the current 120. The wavelengths will be determined at least in part by the dimensions of a resonant cavity bounded by the first DBR 106 and the second DBR 108.

The electrically insulating layer 124 is positioned between the first transport layer 116 and the first electrode 104. The electrically insulating layer 124 can include silicon dioxide or silicon nitride, for example. As shown, the electrically insulating layer 124 comprises an aperture 126. The first electrode 104 is partially positioned within the aperture 126 of the electrically insulating layer 124.

Figure 2:
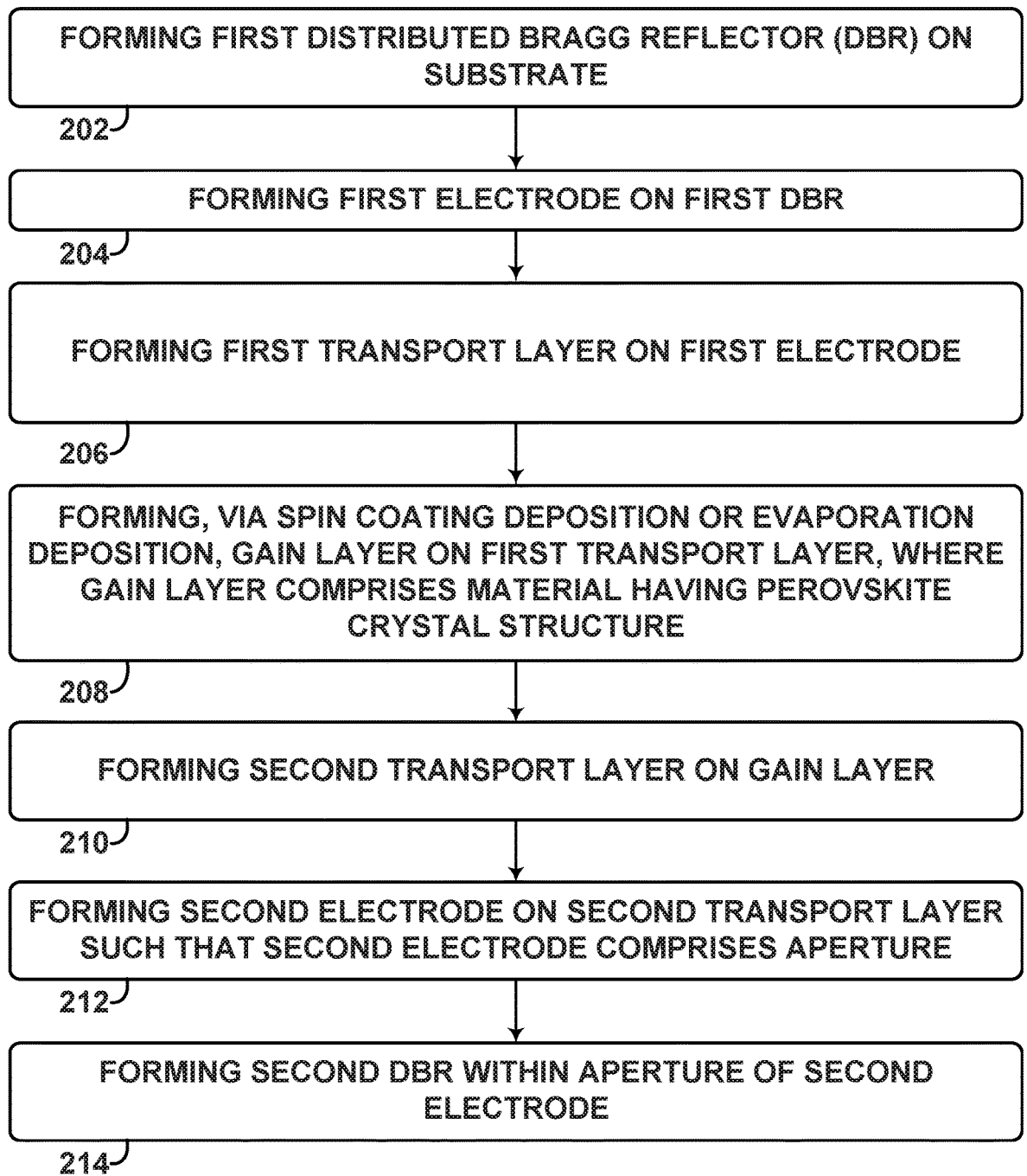
FIG. 2 is a block diagram of a method, according to an example embodiment.

FIG. 2 is a block diagram of a method 200 of fabricating a laser. The method 200 can be used to fabricate the laser 100, for example.

At block 202, the method 200 includes forming a first distributed Bragg reflector (DBR) on a substrate. For example, the first DBR 106 can be formed on (e.g., in contact with) the substrate 102 via sputtering, physical vapor deposition, chemical vapor deposition, spin-on coating, thermal evaporation, thermal oxidation, electron beam evaporation, etc.

Forming the first DBR 106 can include forming the first layer 128 on the substrate 102, forming the third layer 132 on the first layer 128, and forming the second layer 130 on the third layer 132. The thicknesses of the respective layers are chosen with respect to the wavelength of the coherent light 122 to cause interference that results in a resonant cavity having low conductive losses.

At block 204, the method 200 includes forming a first electrode on the first DBR For example, the first electrode 104 can be formed on (e.g., in contact with) the first DBR 106. More specifically, the first electrode 104 can be formed on the layer 134 via sputtering, physical vapor deposition, chemical vapor deposition, spin-on coating, thermal evaporation, electron beam evaporation, etc.

The method 200 can also include forming the electrically insulating layer 124 on the first electrode 104 such that the electrically insulating layer 124 includes the aperture 126. The electrically insulating layer 124 can be formed via sputtering, physical vapor deposition, chemical vapor deposition, spin-on coating, thermal evaporation, thermal oxidation, electron beam evaporation, etc. The portion of the first electrode 104 that extends through the aperture 126 can be deposited thereafter. The aperture 126 can be formed via lithography.

At block 206, the method 200 includes forming a first transport layer on the first electrode. For example, the first transport layer 116 can be formed on the first electrode 104 and the electrically insulating layer 124 via sputtering, physical vapor deposition, chemical vapor deposition, spin-on coating, thermal evaporation, thermal oxidation, electron beam evaporation, etc.

At block 208, the method 200 includes forming, via spin coating deposition or evaporation deposition, a gain layer on the first transport layer. In this context, the gain layer comprises a material having a Perovskite crystal structure. For example, the gain layer 112 can be formed via spin coating deposition or evaporation deposition on the first transport layer 116 and the electrically insulating layer 124.

Spin-coating deposition of the gain layer 112 generally involves spinning the substrate 102 on a platform. In this context, the first DBR 106, the first electrode 104, and the first transport layer 116 and, if included, the electrically insulating layer 124, are already formed on the substrate 102 and are facing upward. The material having the Perovskite crystal structure is dissolved or suspended in a solvent such as toluene, hexane, or chloroform. The liquid mixture of the solvent and the Perovskite material can be applied or poured near the center of the spinning substrate 102, which forms a substantially uniform coating on the first electrode 104 and the electrically insulating layer 124. The thickness of the coating is generally determined by the viscosity and density of the mixture as well as the rotation speed of the platform. After the solvent is allowed to evaporate (e.g., with or without heat being applied), the Perovskite material remains as the gain layer 112 on the substrate 102.

Evaporation deposition of the gain layer 112 can include any known evaporation technique, such as physical vapor deposition, chemical vapor deposition, thermal evaporation, electron beam evaporation, etc. For example, the material having the Perovskite crystal structure can be heated at atmosphere or under vacuum and its vapor can condense or otherwise land on the substrate 102 (e.g., the first transport layer 116).

At block 210, the method 200 includes forming a second transport layer on the gain layer. For example, the second transport layer 118 can be formed on and/or in contact with the gain layer 112 via sputtering, physical vapor deposition, chemical vapor deposition, spin-on coating, thermal evaporation, thermal oxidation, electron beam evaporation, etc.

At block 212, the method 200 includes forming a second electrode on the second transport layer such that the second electrode comprises an aperture. For example, the second electrode 110 can be formed on the second transport layer 118 via sputtering, physical vapor deposition, chemical vapor deposition, spin-on coating, thermal evaporation, thermal oxidation, electron beam evaporation, etc. The aperture 125 can be formed via lithography.

At block 214, the method 200 includes forming a second DBR within the aperture of the second electrode. For example, the second DBR 108 can be formed within the aperture 125 on the second transport layer 118.

Forming the second DBR 108 can include forming the fourth layer 136 on the second transport layer 118, forming the sixth layer 140 on the fourth layer 136, and forming the fifth layer 138 on the sixth layer 140. The thicknesses of the respective layers are chosen with respect to the wavelength of the coherent light 122 to cause interference within the second DBR 108 which in turn results in a resonant cavity having low conductive losses.

Figure 3:
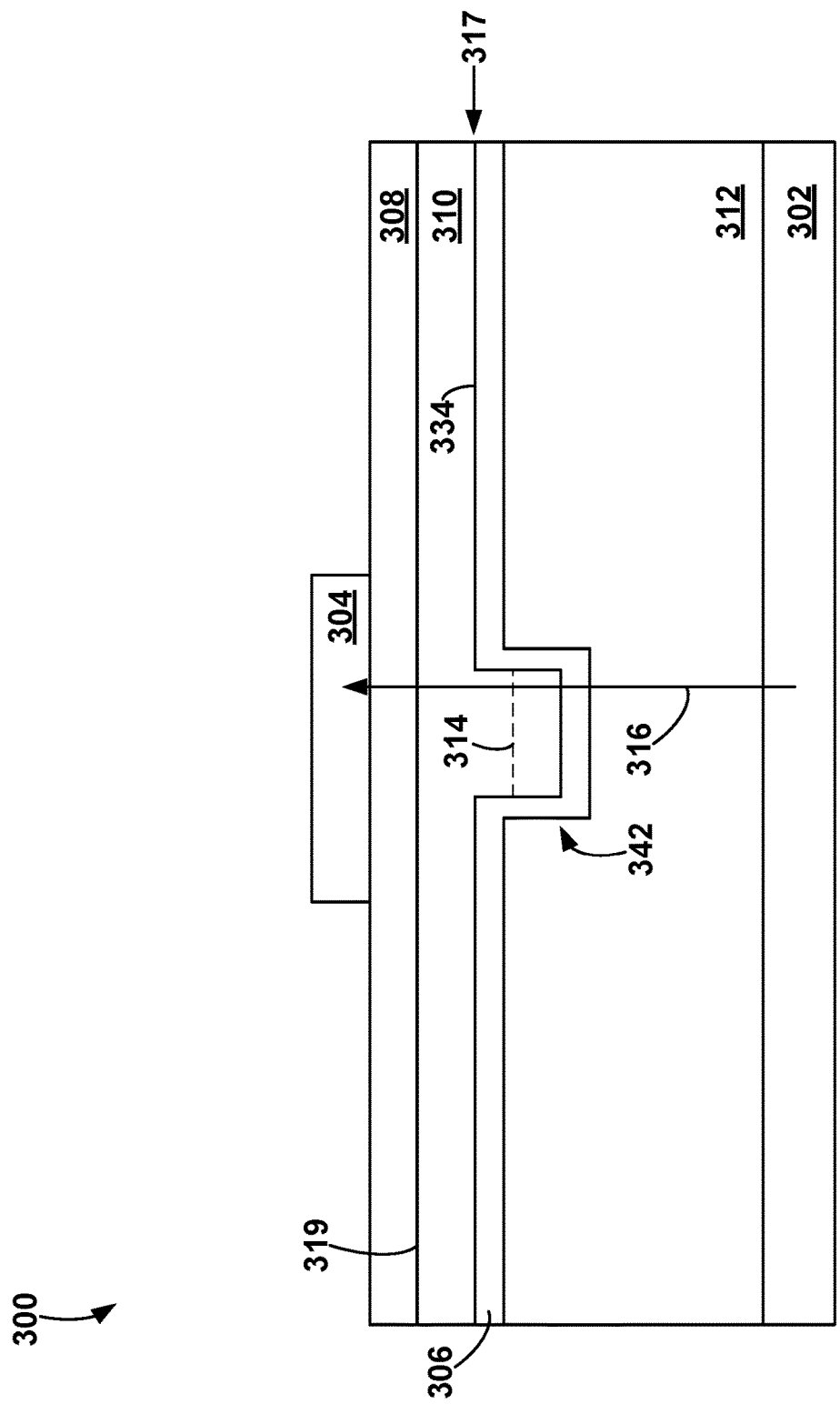
FIG. 3 is a front view cross-sectional schematic diagram of a laser, according to an example embodiment.

FIG. 3 is a front view cross-sectional schematic diagram of a laser 300. The laser 300 includes a first electrode 302 and a second electrode 304, a first transport layer 306 and a second transport layer 308 that are between the first electrode 302 and the second electrode 304, and a gain layer 310 positioned between the first transport layer 306 and the second transport layer 308. The gain layer 310 comprises a material having a Perovskite crystal structure. The laser 300 also includes a substrate 312 on which the first electrode 302, the second electrode 304, the first transport layer 306, the second transport layer 308, and the gain layer 310 are formed. A distributed feedback (DFB) waveguide 314 is formed within the first transport layer 306 (see also FIGS. 4-6). The laser 300 is configured such that a current 316 flowing through the gain layer 310 between the first electrode 302 and the second electrode 304 causes the gain layer 310 to emit coherent light 318 (shown in FIG. 4).

The first electrode 302 and the second electrode 304 can be generally formed of a metal such as aluminum. In some embodiments, the first electrode is formed on a top surface of the substrate 312 and a conductive via can be used to apply a voltage to the first electrode. In contrast, FIG. 3 shows the first electrode 302 being formed on a bottom surface of the substrate 312.

The first transport layer 306 provides either holes or electrons that can take part in a recombination process within the gain layer 310 to emit the coherent light 318. The first transport layer 306 is positioned on top of and/or in contact with the substrate 312. The first transport layer could alternatively be in contact with the first electrode in a different configuration. In some embodiments, the first transport layer 306 is a hole transport layer and can include poly polystyrene sulfonate (PEDOT:PSS). In other embodiments, the first transport layer 306 is an electron transport layer and can include 1,3,5-tris(1-phenyl-1Hbenzo[d]imidazol-2-yl)benzene (TPBI), zinc oxide, and/or lithium fluoride.

The second transport layer 308 provides either holes or electrons that can take part in a recombination process within the gain layer 310 to emit the coherent light 318. For example, if the first transport layer 306 provides holes, the second transport layer 308 provides electrons, and vice versa. The second transport layer 308 is positioned on top of and/or in contact with the gain layer 310. In some embodiments, the second transport layer 308 is a hole transport layer and can include poly polystyrene sulfonate (PEDOT:PSS). In other embodiments, the second transport layer 308 is an electron transport layer and can include 1,3,5-tris(1-phenyl-1Hbenzo[d]imidazol-2-yl)benzene (TPBI) zinc oxide, and/or lithium fluoride.

The gain layer 310 is positioned between the first electrode 302 and the second electrode 304 (e.g. between the first transport layer 306 and the second transport layer 308). The gain layer 310 includes a material having a Perovskite crystal structure, such as a bulk Perovskite material, a quasi-2D Ruddlesden-Popper (RP) perovskite (($PEABr)_2$ $(MABr)_{n-1}Pb_nBr2_n$), or a quantum dot Perovskite material. The material could be $CsPbBr_3$, for example. A Perovskite material included in the gain layer 310 will generally have the chemical formula $AQX_nY_{3-n}$ where A is methylammonium (MA), formamidinium (FA), or Cs, where X and Y is I, Br, or Cl, and where Q is Pb or Sn. Stimulated emission within the gain layer 310 is the source of the coherent light 318.

The substrate 312 can be formed of one or more of silicon, gallium arsenide, glass, or a flexible material. Typically, the substrate 312 is a wafer of monocrystalline silicon or monocrystalline gallium arsenide, a slab of glass (e.g., silicon dioxide), or a piece of flexible plastic or fabric. A trench 342 is formed within the substrate 312. The trench 342 contains the DFB waveguide 314 as shown in FIGS. 4-6.

The current 316 that causes the emission of the coherent light 318 can be provided by an external power supply that is connected to the first electrode 302 and the second electrode 304. As such, the laser 300 is an electrically pumped edge emitting laser.

In some embodiments, the laser 300 includes a printing layer 317 comprising Poly (methyl methacrylate) between the first transport layer 306 and the gain layer 310, for the purpose of forming the DFB waveguide 314 within the first transport layer 306. Poly (methyl methacrylate) can help provide charge balancing of holes and electrons, which can improve the current injection efficiency.

Figure 4:
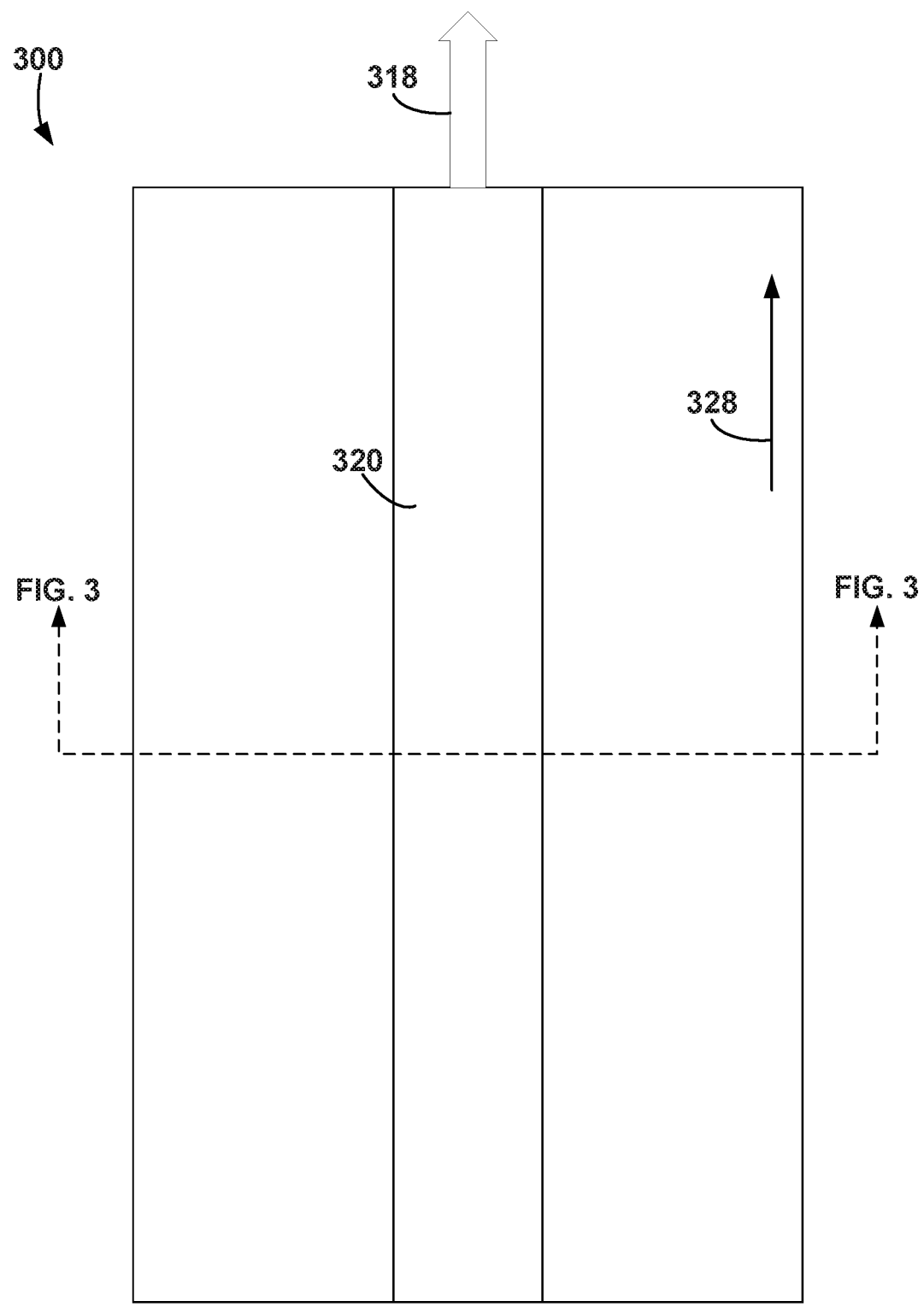
FIG. 4 is a top view schematic diagram of a laser, according to an example embodiment.
Figure 5:
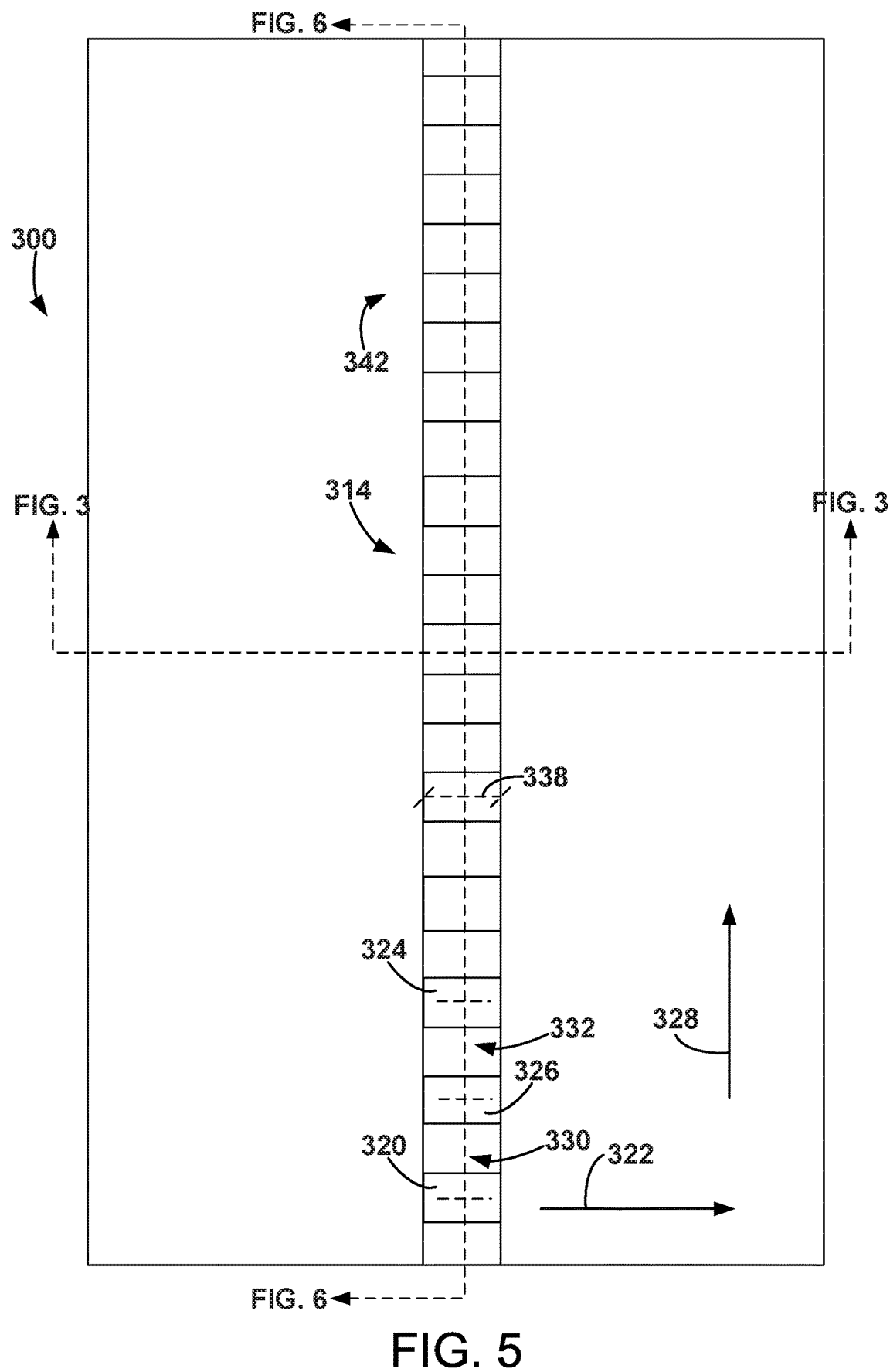
FIG. 5 is a top view cross-sectional schematic diagram of a laser, according to an example embodiment.
Figure 6:
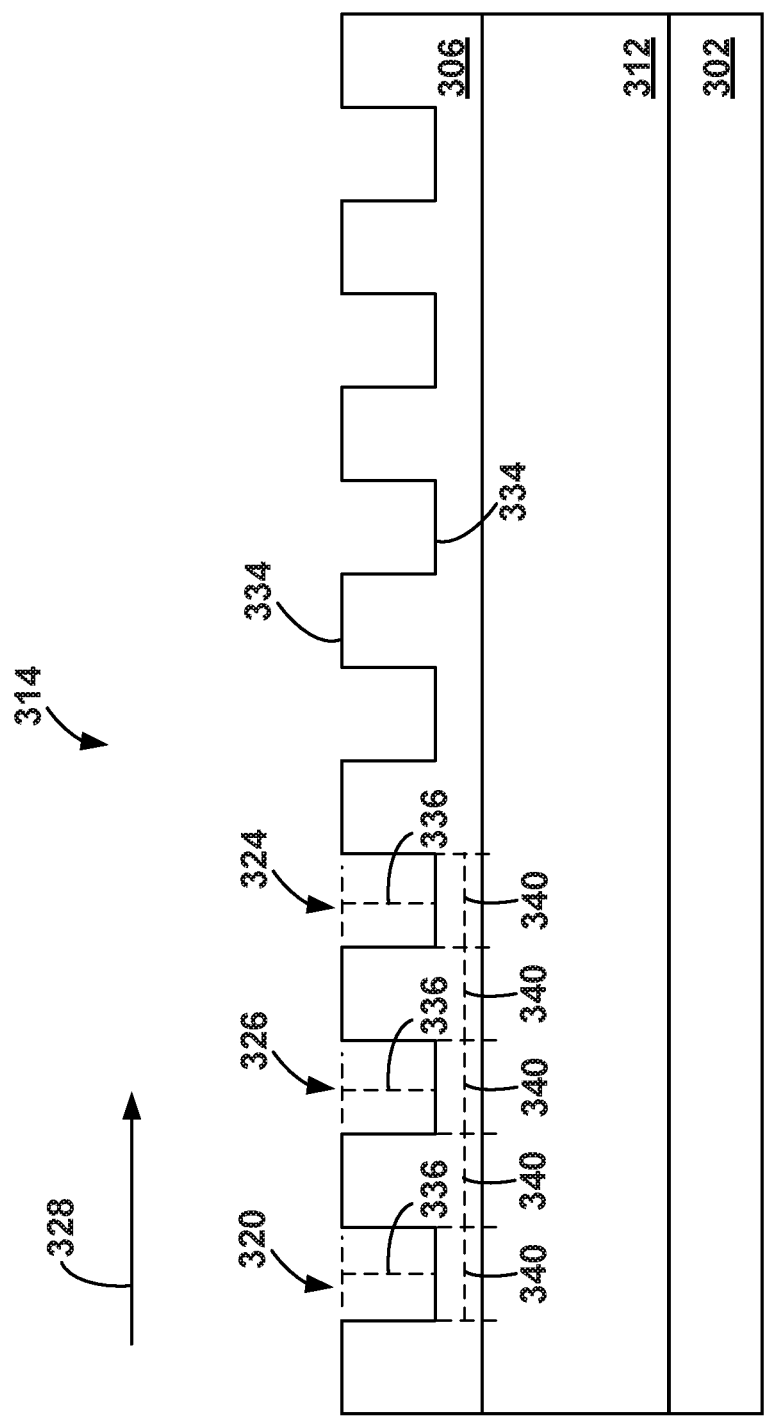
FIG. 6 is a side view cross-sectional schematic diagram of a laser, according to an example embodiment.

The DFB waveguide 314 is shown in more detail in FIGS. 4-6.

FIG. 4 is a top view schematic diagram of the laser 300. The laser 300 is configured to emit the coherent light 318 in a second direction 328 that is substantially parallel to a surface 319 of the gain layer 310 that is in contact with the second transport layer 308.

The trench 342 (shown in FIG. 3) is elongated along the second direction 328.

FIG. 5 is a top view cross-sectional schematic diagram of the laser 300. More specifically, FIG. 5 shows the laser 300 with the second electrode 304, the second transport layer 308, and the gain layer 310 removed, exposing the DFB waveguide 314 formed within the first transport layer 306. FIGS. 5 and 6 show the DFB waveguide 314 in detail, but some dimensions (e.g., dimensions of the grating lines) are exaggerated for the purpose of clarity.

As shown in FIG. 5, the DFB waveguide 314 includes a first grating line 320 formed in the first transport layer 306. The first grating line 320 is elongated in a first direction 322. The DFB waveguide 314 also includes a second grating line 324 formed in the first transport layer 306. The second grating line 324 is elongated in the first direction 322. The DFB waveguide 314 also includes a third grating line 326 formed in the first transport layer 306 between the first grating line 320 and the second grating line 324. The third grating line 326 is elongated in the first direction 322. Along the second direction 328 that is perpendicular to the first direction 322, a first distance 330 between the first grating line 320 and the third grating line 326 is substantially equal to a second distance 332 between the third grating line 326 and the second grating line 324.

The first grating line 320, the second grating line 324, and the third grating line 326 are formed in a surface 334 of the first transport layer 306 that is adjacent to the gain layer 310. Thus, the DFB waveguide 314 forms a periodic structure that can help generate a standing wave in the form of the coherent light 318. The narrow wavelength band of the coherent light 318 is determined by the spacing between the grating lines of the DFB waveguide 314 along the second direction 328.

The first grating line 320, the second grating line 324, and the third grating line 326 generally have respective lengths 338 along the first direction 322 that are greater than 1 sm.

FIG. 6 is a side view cross-sectional schematic diagram of the laser 300.

The first grating line 320, the second grating line 324, and the third grating line 326 generally have respective depths 336 perpendicular to the first direction 322 and the second direction 328 within a range of 40-100 nm.

In some embodiments, the first grating line 320, the second grating line 324, and the third grating line 326 have respective widths 340 along the second direction 328 within a range of 20% of a wavelength of the coherent light 318 to 30% of the wavelength of the coherent light 318 as the coherent light propagates within the laser 300 (e.g., the gain layer). The wavelength of the coherent light within the laser 300 will generally be different (e.g., shorter) than the wavelength of the coherent light 318 outside of the laser, due to differences in refractive indices of the gain layer and air.

In some embodiments, the first grating line 320, the second grating line 324, and the third grating line 326 have respective widths 340 along the second direction 328 within a range of 40% to 60% of the first distance 330.

Figure 7:
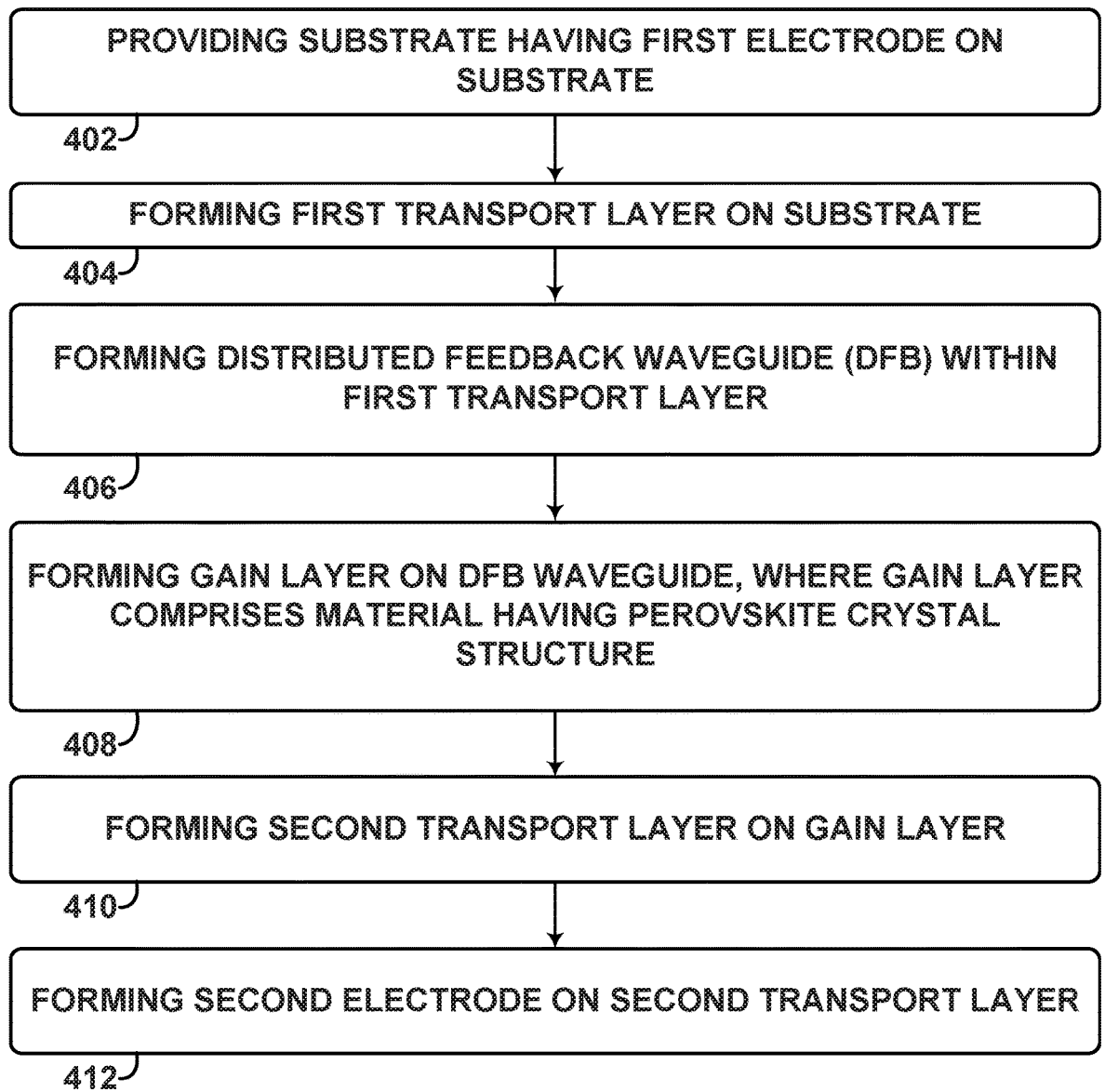
FIG. 7 is a block diagram of a method, according to an example embodiment.

FIG. 7 is a block diagram of a method 400 of fabricating a laser. The method 400 can be used to fabricate the laser 300, for example.

At block 402, the method 400 includes providing a substrate having a first electrode on the substrate. For example, the substrate 312 can be a pre-manufactured substrate having the first electrode 302 pre-formed on a back/bottom surface of the substrate 312. In another embodiment, providing the substrate includes forming the first electrode on the substrate (e.g., on a top/front surface of the substrate. In these embodiments, vias can be formed through layers of the laser 300 to access the first electrode.

The method 400 can also include forming the trench 342 that is elongated along the second direction 328 within the substrate 312. As such, the DFB waveguide 314 can be formed within the trench 342 via lithography, for example. Lithography can be used to form the trench 342 as well.

At block 404, the method 400 includes forming a first transport layer on the substrate. For example, the first transport layer 306 can be formed on the substrate 312 via sputtering, physical vapor deposition, chemical vapor deposition, spin-on coating, thermal evaporation, thermal oxidation, electron beam evaporation, etc. As shown in FIG. 3, a portion of the first transport layer 306 is formed within the trench 342 of the substrate 312.

At block 406, the method 400 includes forming a distributed feedback (DFB) waveguide within the first transport layer. For example, the DFB waveguide 314 can be formed within the first transport layer 306 via lithography (see FIGS. 5 and 6). That is, lithography can be used to form the first grating line 320 in the first transport layer 306, form the second grating line 324 in the first transport layer 306, and form the third grating line 326 in the first transport layer 306. The other unmarked grating lines shown in FIG. 5 can also be formed in the first transport layer 306. The periodic spacing of the grating lines along the second direction 328 helps determine the wavelength of the coherent light 318.

At block 408, the method 400 includes forming a gain layer on the DFB waveguide, where the gain layer comprises a material having a Perovskite crystal structure. For example, the gain layer 310 can be formed (e.g., conformally) on the DFB waveguide 314 (e.g., on the first transport layer 306) as shown in FIGS. 3, 5, and 6. The gain layer 310 can be formed on the DFB waveguide 314 via sputtering, physical vapor deposition, chemical vapor deposition, spin-on coating, thermal evaporation, thermal oxidation, electron beam evaporation, etc.

At block 410, the method 400 includes forming a second transport layer on the gain layer. For example, the second transport layer 308 can be formed on and/or in contact with the gain layer 310 via sputtering, physical vapor deposition, chemical vapor deposition, spin-on coating, thermal evaporation, thermal oxidation, electron beam evaporation, etc.

At block 412, the method 400 includes forming a second electrode on the second transport layer. For example, the second electrode 304 can be formed on the second transport layer 308 via sputtering, physical vapor deposition, chemical vapor deposition, spin-on coating, thermal evaporation, thermal oxidation, electron beam evaporation, etc.

While various example aspects and example embodiments have been disclosed herein, other aspects and embodiments will be apparent to those skilled in the art. The various example aspects and example embodiments disclosed herein are for purposes of illustration and are not intended to be limiting, with the true scope and spirit being indicated by the following claims.

What is claimed is:

1. A laser comprising:
   a first electrode and a second electrode;
   a first transport layer and a second transport layer that are between the first electrode and the second electrode;
   a gain layer positioned between the first transport layer and the second transport layer, wherein the gain layer comprises a material having a Perovskite crystal structure; and
   a substrate on which the first electrode, the second electrode, the first transport layer, the second transport layer, and the gain layer are formed,
   wherein a distributed feedback (DFB) waveguide is formed within the first transport layer, and
   wherein the laser is configured such that a current flowing through the gain layer between the first electrode and the second electrode causes the gain layer to emit coherent light.

2. The laser of claim 1, further comprising a printing layer comprising Poly (methyl methacrylate) between the first transport layer and the gain layer.

3. The laser of claim 1, wherein the material having the Perovskite crystal structure comprises a bulk Perovskite material, a quasi-2D Ruddlesden-Popper (RP) perovskite $((PEABr)_2(MABr)_{n-1}Pb_nBr_{2n})$ and/or a quantum dot Perovskite material.

4. The laser of claim 1, wherein the material having the Perovskite crystal structure comprises $CsPbBr_3$.

5. The laser of claim 1, wherein the first transport layer or the second transport layer comprises poly polystyrene sulfonate (PEDOT:PSS).

6. The laser of claim 1, wherein the DFB waveguide comprises:
   a first grating line formed in the first transport layer, wherein the first grating line is elongated in a first direction;
   a second grating line formed in the first transport layer, wherein the second grating line is elongated in the first direction; and
   a third grating line formed in the first transport layer between the first grating line and the second grating line, wherein the third grating line is elongated in the first direction, and wherein, along a second direction that is perpendicular to the first direction, a first distance between the first grating line and the third grating line is greater than or equal to 95% of and less than or equal to 105% of a second distance between the third grating line and the second grating line.

7. The laser of claim 6, wherein the first grating line, the second grating line, and the third grating line are formed in a surface of the first transport layer that is adjacent to the gain layer.

8. The laser of claim 6, wherein the first grating line, the second grating line, and the third grating line have respective widths along the second direction within a range of 20% of a wavelength of the coherent light to 30% of the wavelength of the coherent light, wherein the wavelength is the wavelength of the coherent light within the gain layer.

9. The laser of any of claim 6, wherein the first grating line, the second grating line, and the third grating line have respective widths along the second direction within a range of 40% to 60% of the first distance.

10. The laser of claim 1, wherein the laser is configured to emit the coherent light in a direction that is parallel to a surface of the gain layer that is in contact with the second transport layer.

11. The laser of claim 6, wherein a trench that is elongated along the second direction is formed within the substrate, and wherein the DFB waveguide is formed within the trench.

12. A method of fabricating a laser, the method comprising:
    providing a substrate having a first electrode on the substrate;
    forming a first transport layer on the substrate;
    forming a distributed feedback (DFB) waveguide within the first transport layer;
    forming a gain layer on the DFB waveguide, wherein the gain layer comprises a material having a Perovskite crystal structure;
    forming a second transport layer on the gain layer; and
    forming a second electrode on the second transport layer,
    wherein the laser is configured such that a current flowing through the gain layer between the first electrode and the second electrode causes the gain layer to emit coherent light.

13. The method of claim 12, wherein forming the DFB waveguide comprises:
    forming a first grating line in the first transport layer, wherein the first grating line is elongated in a first direction;
    forming a second grating line in the first transport layer, wherein the second grating line is elongated in the first direction; and
    forming a third grating line in the first transport layer between the first grating line and the second grating line, wherein the third grating line is elongated in the first direction, and wherein, along a second direction that is perpendicular to the first direction, a first distance between the first grating line and the third grating line is greater than or equal to 95% of and less than or equal to 105% of to a second distance between the third grating line and the second grating line.

14. The method of claim 12, wherein forming the gain layer comprises depositing the gain layer conformally onto the DFB waveguide.

15. The method of claim 12, wherein forming the second transport layer comprises forming the second transport layer via electron beam evaporation or sputtering.

16. The method of claim 13, further comprising forming a trench that is elongated along the second direction within the substrate, and wherein forming the DFB waveguide comprises forming the DFB waveguide within the trench.

17. The method of claim 12, wherein forming the gain layer comprises forming the gain layer via spin on coating deposition or evaporation deposition.

18. The method of claim 12, further comprising forming a printing layer comprising Poly (methyl methacrylate) between the first transport layer and the gain layer.

19. The method of claim 12, further comprising forming a trench within the substrate.

20. The method of claim 19, wherein forming the DFB waveguide comprises forming the DFB waveguide within the trench.

* * * * *